(12) United States Patent
Sutardja

(10) Patent No.: US 7,271,573 B2
(45) Date of Patent: *Sep. 18, 2007

(54) LOW LOSS DC/DC CONVERTER INCLUDING A MULTI-LEVEL CONTROLLER THAT APPLIES A MONOTONIC SEQUENCE OF VOLTAGE LEVELS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 11/505,104

(22) Filed: Aug. 15, 2006

(65) Prior Publication Data

US 2006/0273778 A1    Dec. 7, 2006

Related U.S. Application Data

(63) Continuation of application No. 11/131,106, filed on May 16, 2005, now Pat. No. 7,148,673, which is a continuation of application No. 10/621,058, filed on Jul. 15, 2003, now Pat. No. 7,161,342.

(60) Provisional application No. 60/421,447, filed on Oct. 25, 2002.

(51) Int. Cl.
*H02M 3/155* (2006.01)

(52) U.S. Cl. ............... 323/351; 323/271; 323/288
(58) Field of Classification Search ........... 323/224, 323/271, 288, 351
See application file for complete search history.

(56) References Cited

U.S. PATENT DOCUMENTS

| | | | | |
|---|---|---|---|---|
| 4,430,609 | A | 2/1984 | Van Kessel et al. | 323/350 |
| 5,010,261 | A | 4/1991 | Steigerwald | 307/571 |
| 5,276,603 | A | 1/1994 | Stanley | 363/43 |
| 5,583,460 | A | 12/1996 | Kohi et al. | 327/126 |
| 5,610,807 | A | 3/1997 | Kandra et al. | 363/43 |
| 5,687,067 | A | 11/1997 | Majid et al. | 363/97 |
| 6,430,066 | B2 | 8/2002 | Emori et al. | 363/43 |
| 6,462,962 | B1 | 10/2002 | Cuk | 363/16 |
| 6,489,756 | B2 | 12/2002 | Kanouda et al. | 323/284 |
| 7,148,673 | B2 * | 12/2006 | Sutardja | 353/351 |
| 7,161,342 | B2 * | 1/2007 | Sutardja | 323/351 |
| 2002/0080631 | A1 | 6/2002 | Kanouda et al. | 363/62 |

FOREIGN PATENT DOCUMENTS

| | | |
|---|---|---|
| JP | 02-237220 | 9/1990 |
| JP | 04-172962 | 6/1992 |
| JP | 5-68130 | 9/1993 |
| JP | 6006195 | 1/1994 |

(Continued)

OTHER PUBLICATIONS

U.S. Appl. No. 10/460,825, filed Jan. 15, 2004, Sutardja et al.

(Continued)

*Primary Examiner*—Jeffrey Sterrett

(57) ABSTRACT

A direct current to direct current converter includes first and second switches to output voltages on first and second output terminals in response to appropriate turn-on voltages at first and second control terminals. The first control terminal may selectively communicate with one of N>2 different voltages. The converter may include a first multi-level controller in communication with the first control terminal, the controller including N drivers to selectively apply the N>2 different voltages to the first control terminal.

30 Claims, 7 Drawing Sheets

FOREIGN PATENT DOCUMENTS

| | | |
|---|---|---|
| JP | 08-182305 | 7/1996 |
| JP | 10-023743 | 1/1998 |
| JP | 10-075164 | 3/1998 |
| JP | 2001-352748 | 12/2001 |
| JP | 2002-199708 | 7/2002 |

OTHER PUBLICATIONS

Scott Deuty, "Optimizing Transistor in Synchronous Rectifier, Buck Converters", IEEE, 2000.

English Translation by Computer of Jan. 17, 2006, Japanese Notice of Reason(s) for Rejection (Office Action) for Japanese Patent Application No. 2003-362674 corresponding to U.S. 10,621,058.

Japanese Office Action dated Jun. 7, 2005, received in the Japanese Patent Application No. 2003-362674 (corresponding to U.S. Appl. No. 10/621,058, which is the parent application of U.S. Appl. No. 11/131,106) (human translation included); Document to be published by USPTO.

Japanese Office Action dated Jan. 17, 2006, received in the Japanese Patent Application No. 2003-362674 (corresponding to U.S. Appl. No. 10/621,058, which is the parent application of U.S. Appl. No. 11/131,106) (human translations included); Document to be published by USPTO.

First Chinese Office Action dated Mar. 31, 2006, received in Chinese Patent Application No. 200310101782.X (corresponding to U.S. Appl. No. 10/621,058, which is the parent of U.S. Appl. No. 11/505,104) (human translation included); Document to be published by the USPTO.

Second Chinese Office Action dated Sep. 22, 2006, received in Chinese Patent Application No. 200310101782.X (corresponding to U.S. Appl. No. 10/621,058, which is the parent of U.S. Appl. No. 11/505,104) (human translation included); Document to be published by USPTO.

* cited by examiner

… (US 7,271,573 B2)

LOW LOSS DC/DC CONVERTER INCLUDING A MULTI-LEVEL CONTROLLER THAT APPLIES A MONOTONIC SEQUENCE OF VOLTAGE LEVELS

CROSS-REFERENCE TO RELATED APPLICATIONS

The present application is a continuation of U.S. patent application Ser. No. 11/131,106, entitled "METHOD AND APPARATUS INCLUDING LOW LOSS DC/DC CONVERTER," filed May 16, 2005, now U.S. Pat. No. 7,148,673, which is a continuation of U.S. patent application Ser. No. 10/621,058, entitled "LOW LOSS DC/DC CONVERTER," filed Jul. 15, 2003, now U.S. Pat. No. 7,161,342, which claims priority to commonly assigned U.S. Provisional Patent Application No. 60/421,447, entitled "LOW LOSS DC/DC CONVERTER," filed on Oct. 25, 2002. The disclosures of the prior applications are considered part of (and are incorporated by reference in) the disclosure of this application.

TECHNICAL FIELD

This invention relates to direct current to direct current (DC/DC) converters.

BACKGROUND

In some applications, DC/DC converters may be operated using high switching frequencies. For example, in order to meet response time requirements for particular loads, switching frequencies on the order of tens to hundreds of megahertz may be needed. However, with higher switching frequencies, the power dissipated as a result of the gate switching loss may increase to an unacceptable level.

FIG. 1 shows a DC/DC converter system 100 in a step-down configuration known as a "buck" configuration. A pulse width modulator (PWM) controller 110 controls a p-switch 120 and an n-switch 130, which are implemented using power transistors. A load 140 may be coupled with the output of p-switch 120 and n-switch 130 via an inductor 150 and a capacitor 160.

System 100 may dissipate power in a number of ways, each of which decreases the efficiency of the system. For example, resistive losses due to the on-state drain/source resistance (referred to as $R_{ds\text{-}on}$) reduce the efficiency of the system. In order to reduce power loss due to $R_{ds\text{-}on}$, larger transistors may be used.

However, larger transistors exhibit increased capacitance between the gate and the source, $C_{gs}$. This in turn increases what is termed the gate loss of the transistor. For a voltage V being switched at a frequency f across a capacitance $C_{gs}$, the gate loss is given by Equation (1) below:

$$\text{Gate loss} = \tfrac{1}{2} C_{gs} V^2 f \qquad \text{Equation (1)}$$

At relatively low frequencies (for example, frequencies on the order of about 100 kHz), the gate loss may be significantly less than $R_{ds\text{-}on}$. However, as higher switching frequencies are used, gate loss may make a substantial contribution to the power dissipation in system 100.

SUMMARY

In general, in one aspect, a direct current to direct current converter includes a first switch to output a first voltage on a first output terminal in response to a turn-on voltage at a first control terminal. The converter may also include a second switch to output a second voltage on a second output terminal in communication with the first output terminal in response to a turn-on voltage at a second control terminal.

The first control terminal may selectively communicate with one of N>2 different voltages. The second control terminal may selectively communicate with one of M>2 different voltages.

The first switch and the second switch may comprise, for example, first and second transistors, where the first and second output terminals comprise associated drains of the first and second transistors, and where the first and second control terminals comprise associated gates of the first and second transistors.

The converter may also include a first multi-level controller in communication with the first control terminal. The first multi-level controller may include N>2 drivers, where each of the n=1 to n=N drivers is to selectively apply a different voltage $V_n$ to the first control terminal. The N drivers may be to selectively apply the different voltage for a time sufficient for the voltage at the first control terminal to substantially equilibrate with the different voltage.

The converter may also include a second multi-level controller in communication with the second control terminal. The second multi-level controller may include M>2 drivers, where each of the m=1 to m=N drivers is to selectively apply a different voltage $V_m$ to the second control terminal. The first and second multi-level controllers may be to turn on the first switch and the second switch alternately. The first output terminal and the second output terminal may be in communication with a load; for example, via an inductor and a capacitor.

In general, in another aspect, a direct current to direct current converter includes an integrated circuit. The integrated circuit includes a first switch to output a first voltage on a first output terminal in response to a turn-on voltage at a first control terminal. The integrated circuit may also include a second switch to output a second voltage on a second output terminal in communication with the first output terminal in response to a turn-on voltage at a second control terminal.

The integrated circuit may also include a first multi-level controller in communication with the first control terminal. The first multi-level controller may include N>2 drivers, where each of the n=1 to n=N drivers is to selectively apply a different voltage $V_n$ to the first control terminal. At least one of the N drivers may comprise an associated capacitance.

The converter may also include a capacitor separate from the integrated circuit, where the capacitance of the capacitor is included in the associated capacitance of one of the N drivers. The capacitor may be one of P capacitors, where a capacitance of each of the P capacitors is included in the associated capacitance of at least one of the N drivers.

The integrated circuit may also include a second multi-level controller in communication with the second control terminal. The second multi-level controller may include M>2 drivers, where each of the m=1 to m=N drivers is to selectively apply a different voltage $V_m$ to the second control terminal.

In general, in one aspect, a direct current to direct current converter may comprise a first switching-assembly including I switches to output a voltage on an associated output terminal in response to a turn-on voltage at an associated control terminal, each of the associated output terminals in communication with a first switching assembly output terminal configured to output a voltage to a load. One or more of the I switches may include an associated multi-level controller in communication with an associated control terminal. An i-th one of the associated multi-level controllers may include N(i) drivers, each of the n(i)=1 to n(i)=N(i) drivers to selectively apply a different voltage $V_{n(i)}$ to the associated control terminal, where N(i) is greater than two for at least one of the I switches.

The converter may further comprise a second switching assembly including J switches. Each of the J switches may be to output a voltage on an associated output terminal in response to a turn-on voltage at an associated control terminal. Each of the associated output terminals may be in communication with a second switching assembly output terminal. The second switching assembly output terminal may be in communication with the first switching assembly output terminal.

One or more of the J switches may include an associated multi-level controller in communication with an associated control terminal. For example, a j-th one of the associated multi-level controllers may include N(j) drivers, each of the n(j)=1 to n(j)=N(j) drivers to selectively apply a different voltage $V_{n(j)}$ to the associated control terminal, where N(j) is greater than two for at least one of the J switches.

In general, in one aspect, a method may include alternately generating a first output voltage at an output of a first switching assembly including I switches and generating a second output voltage at an output of a second switching assembly including J switches. The output of the first switching assembly may be in communication with the output of the second switching assembly.

Generating the first output voltage may comprise turning on the first switching assembly, which may comprise selectively applying n(i)=1 to n(i)=N(i) different voltages $V_{n(i)}$ to an associated control terminal of an i-th one of the I switches. Selectively applying the different voltages $V_{n(i)}$ may comprise applying a voltage $V_{1(i)}$ at which the i-th switch is off, subsequently applying an intermediate voltage $V_{int(i)}$, and subsequently applying a voltage $V_{N(i)}$ at which the i-th switch is on, wherein $V_{int(i)}$ is between $V_{1(i)}$ and $V_{N(i)}$.

Generating the second output voltage may comprise turning on the second switching assembly. Turning on the second switching assembly may comprise selectively applying m(j)=1 to m(j)=M(j) different voltages $V_{m(j)}$ to an associated control terminal of a j-th one of the J switches. Selectively applying the different voltages $V_{m(j)}$ may comprise applying a voltage $V_{1(j)}$ at which the j-th switch is off, subsequently applying an intermediate voltage $V_{int(j)}$, and subsequently applying a voltage $V_{M(j)}$ at which the j-th switch is on, wherein $V_{int(j)}$ is between $V_{1(j)}$ and $V_{M(j)}$.

The method may further comprise filtering the first output voltage and the second output voltage to produce a generally direct current voltage. The generally direct current voltage may be applied to a load.

Turning on the first switching assembly may comprise selectively applying a voltage $V_2$ in turn to a plurality of the I switches and applying a voltage $V_3$ to the plurality of the I switches. The method may include applying $V_2$ to at least one of the I switches and applying $V_3$ to a different one of the I switches at the same time.

In general, in one aspect, a direct current to direct current converter may comprise means for generating a first output voltage at a node of the direct current to direct current converter. The converter may further comprise means for generating a second output voltage alternately with the first output voltage at the node. The means for generating the first output voltage may comprise means for selectively applying n=1 to n=N(i) different voltages to a control terminal of an i-th one of I switches, wherein the different voltages include a voltage $V_{1i}$ at which the associated i-th switch is off, a voltage $V_{N(i)i}$ at which the associated i-th switch is on, and a voltage $V_{int(i)}$ between $V_{1i}$ and $V_{N(i)i}$.

In general, in one aspect, a direct current to direct current converter may include a first switching means for outputting a first voltage on a first output terminal means in response to a turn-on voltage at a first control terminal means. The converter may further include a second switching means for outputting a second voltage on a second output terminal means in communication with the first output terminal means in response to a turn-on voltage at a second control terminal means.

The first control terminal means may selectively communicate with one of N>2 voltages. The second control terminal means may selectively communicate with one of M>2 voltages.

The converter may further include a first multi-level controlling means for controlling the first switching means. The first multi-level controlling means may be in communication with the first control terminal means, and may include N driving means, each of the n=1 to n=N driving means for selectively applying a different voltage $V_n$ to the first control terminal means, where N is greater than two.

In general, in one aspect, a direct current to direct current converter may include an integrated circuit. The integrated circuit may include a first switching means for outputting a first voltage on a first output terminal means in response to a turn-on voltage at a first control terminal means. The integrated circuit may further include a second switching means for outputting a second voltage on a second output terminal means in communication with the first output terminal means in response to a turn-on voltage at a second control terminal means.

The integrated circuit may further include a first multi-level controlling means for controlling the first switching means. The first multi-level controlling means may be in communication with the first control terminal means, and may include N driving means, each of the n=1 to n=N driving means for selectively applying a different voltage $V_n$ to the first control terminal means, where N is greater than two. At least one of the N driving means may include an associated capacitance means.

The converter may further include a second capacitance means separate from the integrated circuit, a capacitance of the second capacitance means included in the associated capacitance of one of the N driving means.

In general, in one aspect, a direct current to direct current converter may include a first switching assembly means, the first switching assembly means including I switching means for outputting a voltage on an associated output terminal means in response to a turn-on voltage at an associated control terminal means. Each of the associated output terminal means may be in communication with a first switching assembly means output terminal means configured to output a voltage to a load. One or more of the I switching means may further include an associated multi-level controlling means for controlling the switching means, the associated multi-level controlling means in communication with an associated control terminal means. An i-th one of the associated multi-level controlling means may include N(i) driving means, each of the n(i)=1 to n(i)=N(i) driving means for selectively applying a different voltage $V_{n(i)}$ to the associated control terminal means, where N(i) is greater than two for at least one of the I switching means.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

A low loss DC/DC converter as described herein may provide significant benefits at increased switching frequencies. Output regulators such as DC/DC converters are described in U.S. Patent Application Ser. No. 10/460,825, filed Jun. 12, 2003, which is hereby incorporated by reference in its entirety.

Figure 1:
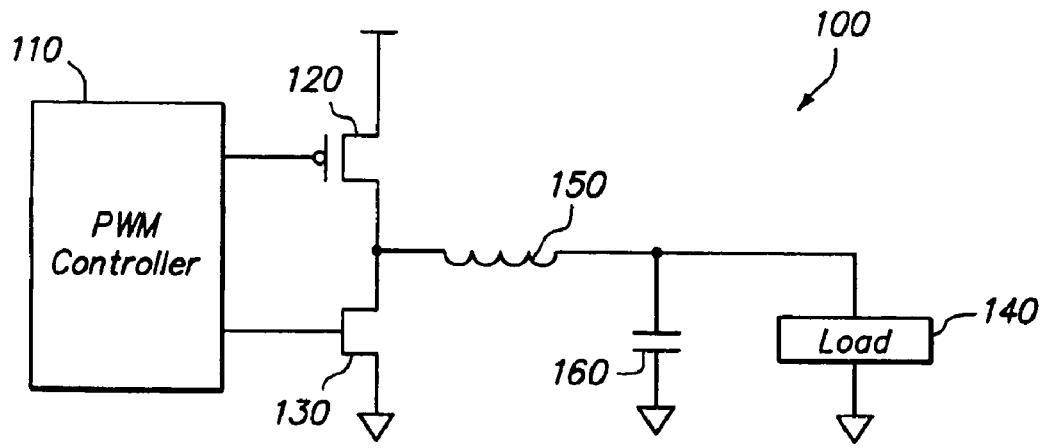
FIG. 1 is a schematic of a DC/DC converter according to the prior art.
Figure 2:
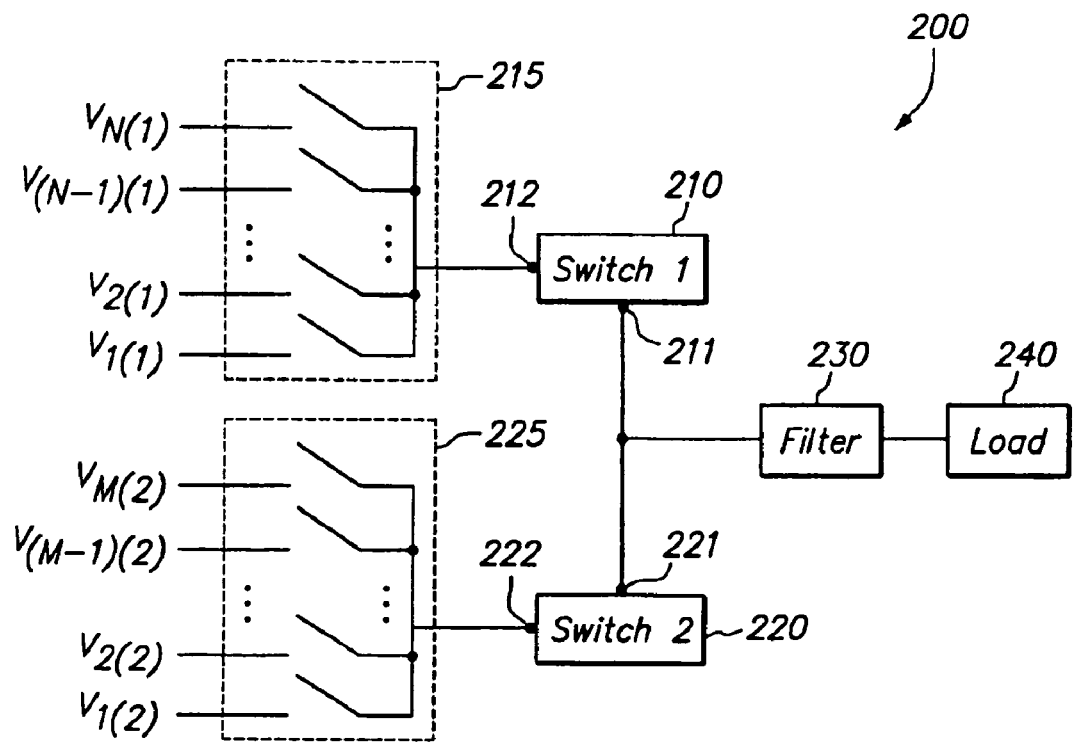
FIG. 2 is a schematic of an implementation of a DC/DC converter.

As noted above, a DC/DC converter may provide a generally DC voltage to a load by filtering the output of two switches that are turned on and off alternately. FIG. 2 shows a system 200 for low loss DC/DC conversion according to some implementations.

System 200 includes a first switch 210 and a second switch 220. First switch 210 may output a voltage on a first output terminal 211 in response to a turn-on voltage at a first control terminal 212. Similarly, second switch 220 may output a voltage on a second output terminal 221 in response to a turn-on voltage at a second control terminal 2221. First switch 210 and second switch 220 may be turned on and off alternately, and their outputs filtered using a filter 230. The filtered, generally DC output may be provided to a load 240.

Rather than turning on first switch 210 and second switch 220 by switching a voltage at the associated control terminal directly from a voltage at which the switch is off to a voltage at which the switch is on, the associated control terminal may selectively communicate with one of a number of different voltages. That is, first switch 210 and second switch 220 may selectively communicate with a first voltage at which the associated switch is off, a second voltage at which the associated switch is on, and one or more intermediate voltages between the first voltage and the second voltage.

The associated control terminal may selectively communicate with the different voltages in a number of ways. For example, system 200 may include a multi-level connector 215 to selectively communicate the N different voltage levels with first control terminal 212. For first switch 210, $V_{1(1)}$ may be a voltage at which first switch 210 is off, while $V_{N(1)}$ may be a voltage at which first switch 210 is on. Rather than directly switching between $V_{1(1)}$ and $V_{1(N)}$, multi-level connector 215 selectively communicates one or more intermediate voltages such as $V_{2(1)}$ and $V_{(N-1)(1)}$ with first control terminal 212. Similarly, a second multi-level connector 225 may selectively communicate M different voltage levels $V_{1(2)}$ through $V_{M(2)}$ with second control terminal 222 to turn on second switch 220.

First switch 210 and second switch 220 may be turned off in a similar manner. That is, the associated control terminal may selectively communicate with one of a number of different voltages, rather than being directly switched from a second voltage at which the associated switch is on to a first voltage at which the associated switch is off.

A DC/DC converter according to FIG. 2 may be more efficient than one in which the switches are turned on and off conventionally. In an illustrative example, first switch 210 and second switch 220 may be implemented as first and second transistors, and first control terminal 212 and second control terminal 222 may be associated gates of the transistors.

For first switch 210, $V_{1(1)}$ corresponds to a voltage at which the transistor is off, while $V_{N(1)}$ corresponds to a voltage at which the transistor is fully on. Similarly, for second switch 220, $V_{1(2)}$ corresponds to a voltage at which the transistor is off, while $V_{M(2)}$ corresponds to a voltage at which the transistor is fully on. The first and second transistors each have an associated gate source capacitance $C_{gs}$.

As noted above, a transistor switch operating at a frequency f may have an associated gate loss that depends on $C_{gs}$. According to Equation (1), if the gate voltage were switched directly between $V_{1(1)}$ and $V_{N(1)}$, the gate loss for the first switch would be equal to $$C_{gs} \frac{(V_{N(1)} - V_{1(1)})^2}{2} f.$$

Assuming N equally spaced voltage levels, for each of the (N−1) voltage changes, the gate loss per voltage change is shown in Equation (2):

$$\text{Gate } loss_{per\ level} = \frac{1}{2} C_{gs} \left( \frac{V_{N(1)} - V_{1(1)}}{N-1} \right)^2 f \quad \text{Equation (2)}$$

Since there are N−1 steps, the net gate loss is given by Equation (3):

$$\text{Gate } Loss_{net} = C_{gs} \frac{(V_{N(1)} - V_{1(1)})^2}{2(N-1)} f \quad \text{Equation (3)}$$

Thus, the theoretical net gate loss is 1/(N−1) times the loss obtained in a system switching directly between $V_{1(1)}$ and $V_{N(1)}$ (either turning on or turning off the first switch). The achieved improvement in gate loss may be less than the theoretical level. For example, if the gate voltage does not completely settle to an intermediate voltage level prior to switching to the next level, the actual improvement in gate loss may be less than the theoretical level.

As Equation (3) illustrates, using larger values of N may lead to greater improvements in the net gate loss. However, since stepping through the intermediate voltage levels takes a finite time, N is generally chosen as an appropriate value for improving gate loss and completing the switching within a reasonable time. In some implementations, N may be in the range from four to eight.

Figure 3A:
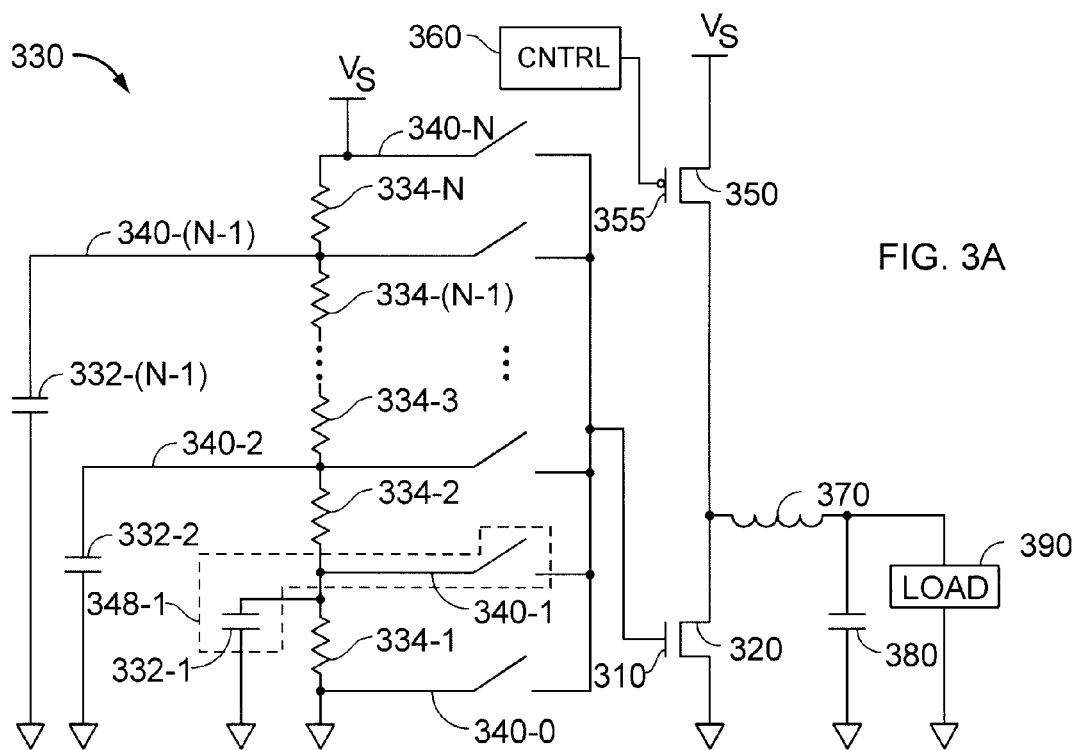
FIG. 3A is a schematic of another implementation of a DC/DC converter.

FIG. 3A shows a DC/DC conversion system 300 according to some implementations. A gate 310 of a first NMOS transistor 320 is in communication with a multi-level controller 330. Controller 330 selectively applies discrete voltage levels 340-0 through 340-N to gate 310. Multi-level controller 330 may include N+1 drivers such as driver 348-1. Driver 348-1 includes a capacitance 332-1 for charge storage and recycling, as well as a switching mechanism to selectively apply voltage level 340-1 to gate 310. Some of the N+1 drivers may include a switching mechanism to selectively apply an associate voltage to the gate but may not include an associated capacitor. The value of capacitance 332-1 may be chosen to provide sufficient charge storage and recycling capability. For a transistor with a gate-source capacitance $C_{gs}$, capacitance 332-1 is generally much greater than $C_{gs}$. System 300 may further include a second multi-level controller 360. Multi-level controller 360 may be in communication with a gate 355 of a second PMOS transistor 350. Multi-level controller 360 may include M drivers to selectively apply M different voltage levels to gate 355.

In some implementations, at least a portion of multi-level controller 330 may be included in an integrated circuit. However, since the capacitance used for charge storage and recycling is generally much greater than $C_{gs}$, including all of the capacitance on the integrated circuit may be difficult and expensive. Therefore, it may be beneficial to provide some charge storage capacity off-chip; that is, separate from an integrated circuit including other elements of multi-level controller 330.

First transistor 320 and second transistor 350 may be turned on alternately; that is, first transistor 320 may be turned on while second transistor 350 is off (or in some cases, barely on), and vice versa. A generally DC voltage may be provided to a load 390 by filtering the signal at the drain of first transistor 320 and second transistor 350 using an inductor 370 and a capacitor 380.

First transistor 320 may be turned on and off by switching a voltage at gate 310 between a first voltage 340-0 at which first transistor 320 is off and a second voltage 340-N at which first transistor 310 is on. However, rather than directly switching gate 310 of transistor 320 between first voltage 340-0 and second voltage 340-N (e.g., between 0 volts and 5 volts or 12 volts), gate 310 is switched between the first voltage and the second voltage via intermediate voltage levels 340-1 through 340-(N−1).

The different voltage levels 340-0 through 340-N may be provided using, for example, a voltage divider including resistors 334-1 through 334-N as shown. Note that resistors 334-1 through 334-N should be large so that minimal power is dissipated in the voltage divider. In some implementations, resistors 334-1 through 334-N may be substantially the same, so that the voltage levels are equally spaced. In other implementations, at least one of the resistors 334-1 through 334-N may be different from one or more of the other resistors.

Note that the voltage divider shown in FIG. 3A is only one of many alternatives for providing different voltage levels. Other configurations may be used. For example, voltage sources utilizing op-amps, digital to analog (D/A) converters, or current sources may be used.

Figure 3B:
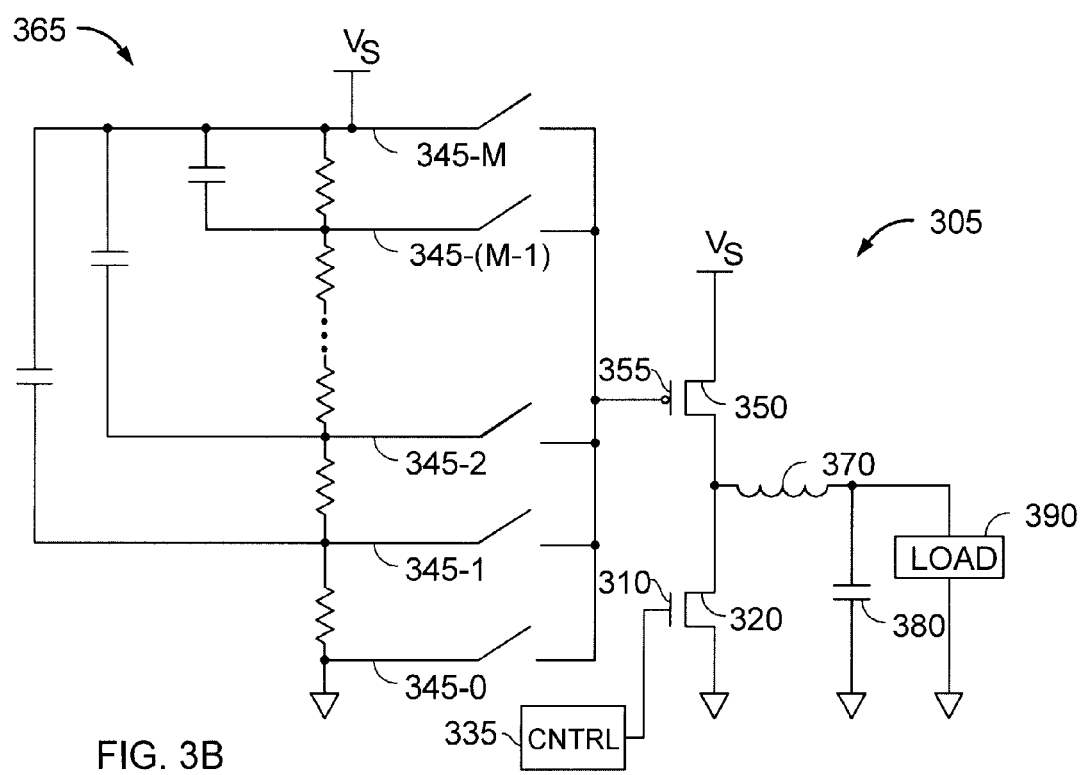
FIG. 3B is a schematic of another implementation of a DC/DC converter.

FIG. 3B shows a system 305, according to an implementation where a second transistor 350 is implemented as a PMOS transistor. A gate 355 of second transistor 350 is in communication with a multi-level controller 365. Controller 365 selectively applies discrete voltage levels 345-0 through 345-M to gate 355. In system 305, a first transistor 320 is implemented as an NMOS transistor, with a controller 335 in communication with a gate 310 of first transistor 320. As with the implementation of FIG. 3A, the different voltage levels 345-0 through 345-M may be provided using a resistive voltage divider, while capacitive charge storage and recycling may be provided using capacitors.

Figure 4:
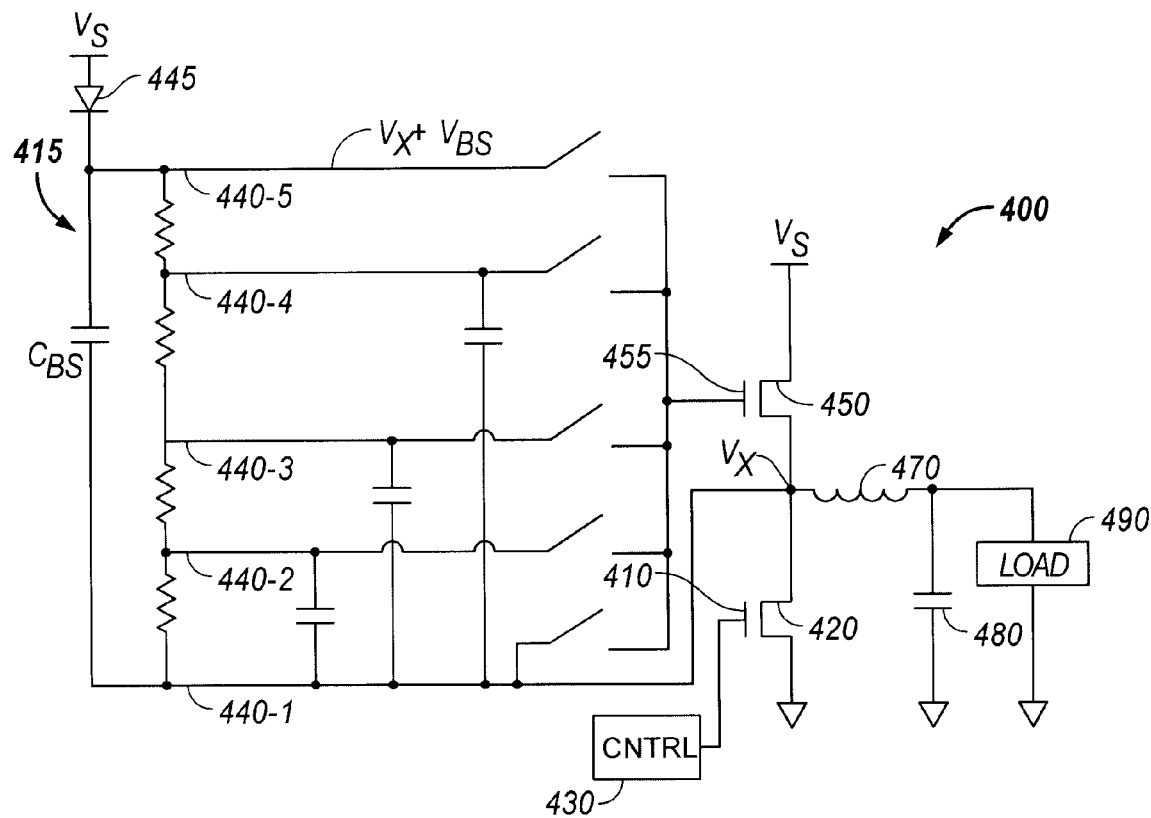
FIG. 4 is a schematic of another implementation of a DC/DC converter.

FIG. 4 shows a system 400, in which a first transistor 420 and a second transistor 450 are both implemented as NMOS transistors. A first multi-level controller 430 selectively communicates N different voltage levels with gate 410 of first transistor 420, while a second multi-level controller 415 selectively communicates M different voltage levels with gate 455 of second transistor 450.

In the example shown in FIG. 4, M is equal to five. Second multi-level controller 415 selectively applies voltage levels 440-1 through 440-5 to gate 455. For this implementation, voltage level 440-1 is equal to the voltage $V_X$ at the drains of first transistor 420 and second transistor 450. A node corresponding to voltage level 440-5 is connected to a bootstrap voltage $V_{BS}$ via a diode 445, and thus, for an ideal diode, voltage level 440-5 is equal to $V_X+V_{BS}$. The node corresponding to voltage level 440-5 is connected to a node corresponding to voltage level 440-1 via a bootstrap capacitor with capacitance equal to $C_{BS}$.

FIG. 4 shows a resistive voltage divider that determines the intermediate voltage levels. When each of the resistances in the voltage divider are equal, voltage level 440-2 is equal to ¼ ($V_X+V_{BS}$), voltage level 440-3 is equal to ½ ($V_X+V_{BS}$), and voltage level 440-4 is equal to ¾ ($V_X+V_{BS}$). As noted above with respect to FIG. 3A, other configurations may be used to provide the different voltage levels.

The systems and techniques described herein may provide additional advantages. For example, when first switch 210 and second switch 220 of FIG. 2 are implemented as transistors (as in FIGS. 3A, 3B, and 4), selectively applying a number of different voltages rather than directly switching the transistor on and off may reduce transistor stress, and thus decrease the mean time to failure of the associated transistors.

Figure 5A:
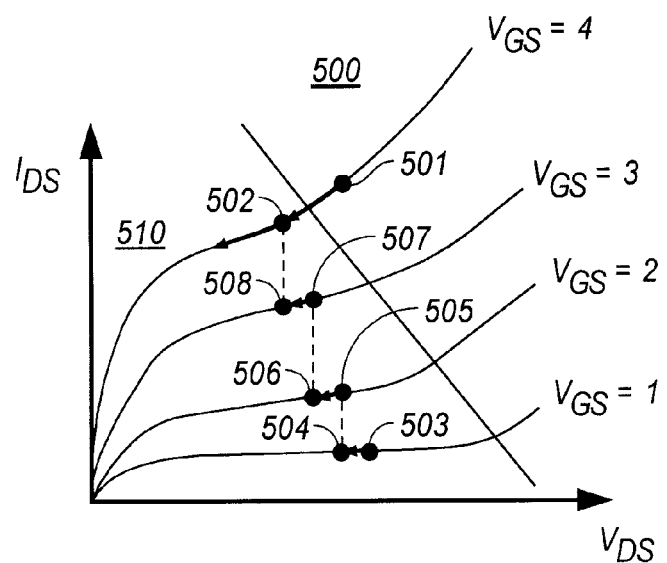
FIG. 5A is a plot of $I_{DS}$ versus $V_{DS}$ for different values of $V_{GS}$.

FIG. 5A shows a plot of the drain-source current IDS versus drain-source voltage $V_{DS}$ for different values of the gate source voltage $V_{GS}$. In a higher stress region 500 of FIG. 5A corresponding to high values of $V_{GS}$ and $V_{DS}$, the transistor experiences stress and may begin to break down. Repeated and/or prolonged periods of high transistor stress may shorten the lifetime of the transistor.

Switching the gate voltage directly from a voltage at which the transistor is off ($V_{off}$) to a voltage at which the transistor is fully on ($V_{on}$) may place the transistor in higher stress region 500 of FIG. 5A. For example, just after the gate voltage is switched from $V_{off}$ to $V_{on}$, both $V_{DS}$ and $V_{GS}$ may be high, and the transistor may be operating at $V_{DS}$ and $V_{GS}$ corresponding to point 501 in higher stress region 500. $V_{DS}$ decreases as the region under the gate is depleted of majority carriers and an inversion layer is created. After a time, $V_{DS}$ and $V_{GS}$ correspond to a point 502 in lower stress region 510. Generally, the longer the time spent in higher stress region 500, the greater the impact on transistor lifetime.

By selectively applying one or more intermediate voltage levels to the gate rather than directly switching the voltage between $V_{on}$ and $V_{off}$ (e.g., using the systems described above and illustrated in FIGS. 3A, 3B, and 4), $V_{GS}$ and $V_{DS}$ may remain in lower stress region 510 of FIG. 5A. For example, a transistor may be turned on by selectively applying intermediate voltage levels corresponding to those shown in FIG. 5A. The voltage may first be increased from $V_{off}$ to the first intermediate voltage level with $V_{GS}$=1. Just after the voltage is changed, $V_{GS}$ and $V_{DS}$ correspond to a point 503 in lower stress region 510 of FIG. 5A. Depletion of the majority carriers in the region under the gate begins, and the drain source voltage decreases, so that the transistor is operating at a point 504.

The voltage may then be increased from $V_{GS}$=1 to $V_{GS}$=2. Just after the voltage is changed, the transistor is operating at a point 505, which is still in lower stress region 510. $V_{DS}$ continues to decrease, until the transistor is operating at a point 506. Similarly, just after the gate voltage is increased from $V_{GS}$=2 to $V_{GS}$=3, the transistor is operating at a point 507, then at a point 508 corresponding to a lower value of $V_{DS}$. Finally, just after the gate voltage is increased from $V_{GS}$=3 to $V_{GS}$=4 ($V_{on}$), the transistor is operating at point 502 in lower stress region 510, and follows the curve to lower levels of $V_{DS}$ as shown.

For the turn-on process described above, each of the points 502-508 are in lower stress region 510 rather than higher stress region 500. Thus, selectively applying intermediate voltage levels to the gate may reduce or eliminate the time the transistor is operating in higher stress region 500.

Figure 5B:
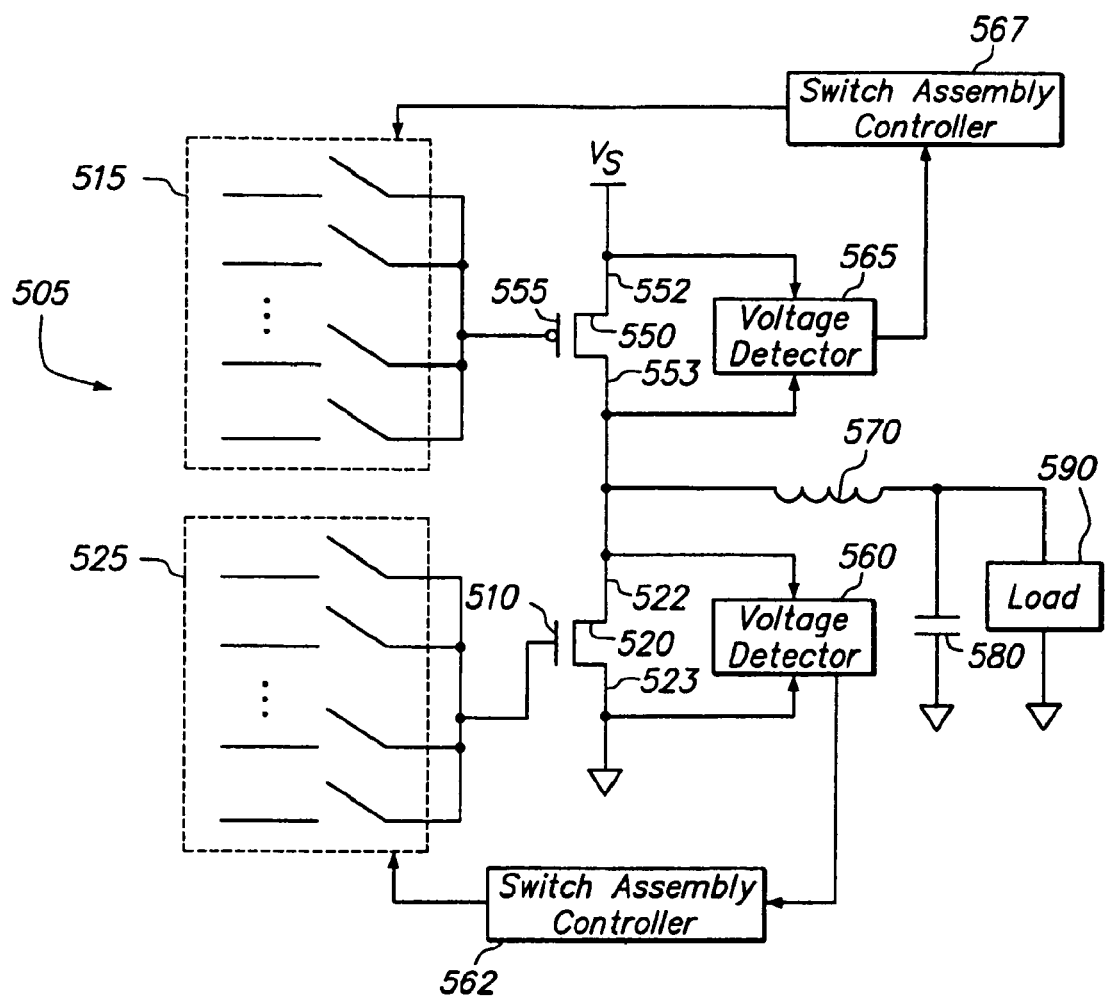
FIG. 5B is a schematic of an implementation of a DC/DC converter including a switch assembly controller.

In some implementations, a switch assembly controller may be provided to control the timing of the voltage changes so that high stress conditions may be avoided. Providing a switch assembly controller may allow the switching to be accomplished in a minimum time compatible with a particular stress threshold. FIG. 5B shows a system 505 including such a switch assembly controller. System 505 includes a first transistor switch 520 that may be turned on and off by selectively applying different voltage levels to a gate 510. For example, a multi-level connector 525 (which may be part of a multi-level controller) may selectively apply different voltages to gate 510.

System 505 includes a second transistor switch 550 that may be turned on and off by selectively applying different voltage levels to a gate 555 using a multi-level connector 515. A voltage detector 560 in communication with a drain 522 of first transistor 520 and a source 523 of first transistor 520 measures the source/drain voltage $V_{DS}$. Similarly, a voltage detector 565 may measure $V_{DS}$ for second switch 550. The output of voltage detector 560 may be provided to a switch assembly controller 562.

In order to turn on first switch 520, the gate voltage may be changed from a first voltage at which first switch 520 is off to a first intermediate voltage level. Voltage detector 560 outputs $V_{DS}$ to switch assembly controller 562. Switch assembly controller 562 may compare a measured value of $V_{DS}$ provided by voltage detector 560 with a threshold value $V_{DS}$(threshold). When the measured value of $V_{DS}$ is below $V_{DS}$(threshold), switch assembly controller 562 may provide a signal to multi-level connector 525 to change the voltage at gate 510 from the first intermediate voltage level to a second intermediate voltage level. The process may be repeated until the voltage level at gate 510 is sufficient to fully turn on first switch 520. A similar process may be used to turn second switch 550 off and on, using voltage detector 565 and a switch assembly controller 567. Note that although separate voltage detectors and switch assembly controllers are shown in FIG. 5B, they need not be separate.

Figure 6:
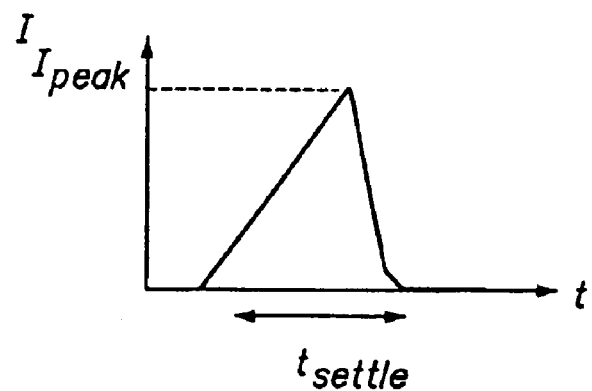
FIG. 6 is a plot of current as a function of time for a single transistor implementation.

As noted above, if the gate voltage does not completely settle to an applied intermediate voltage level prior to switching to the next level, the actual improvement in gate loss may be less than the theoretical level. However, using a single multi-level controller/transistor system may require impractically long settling times. FIG. 6 shows the relationship of the current flow from one of the storage capacitors to the gate of the power transistor. The current exhibits both a large peak and a long settling time.

Figure 7:
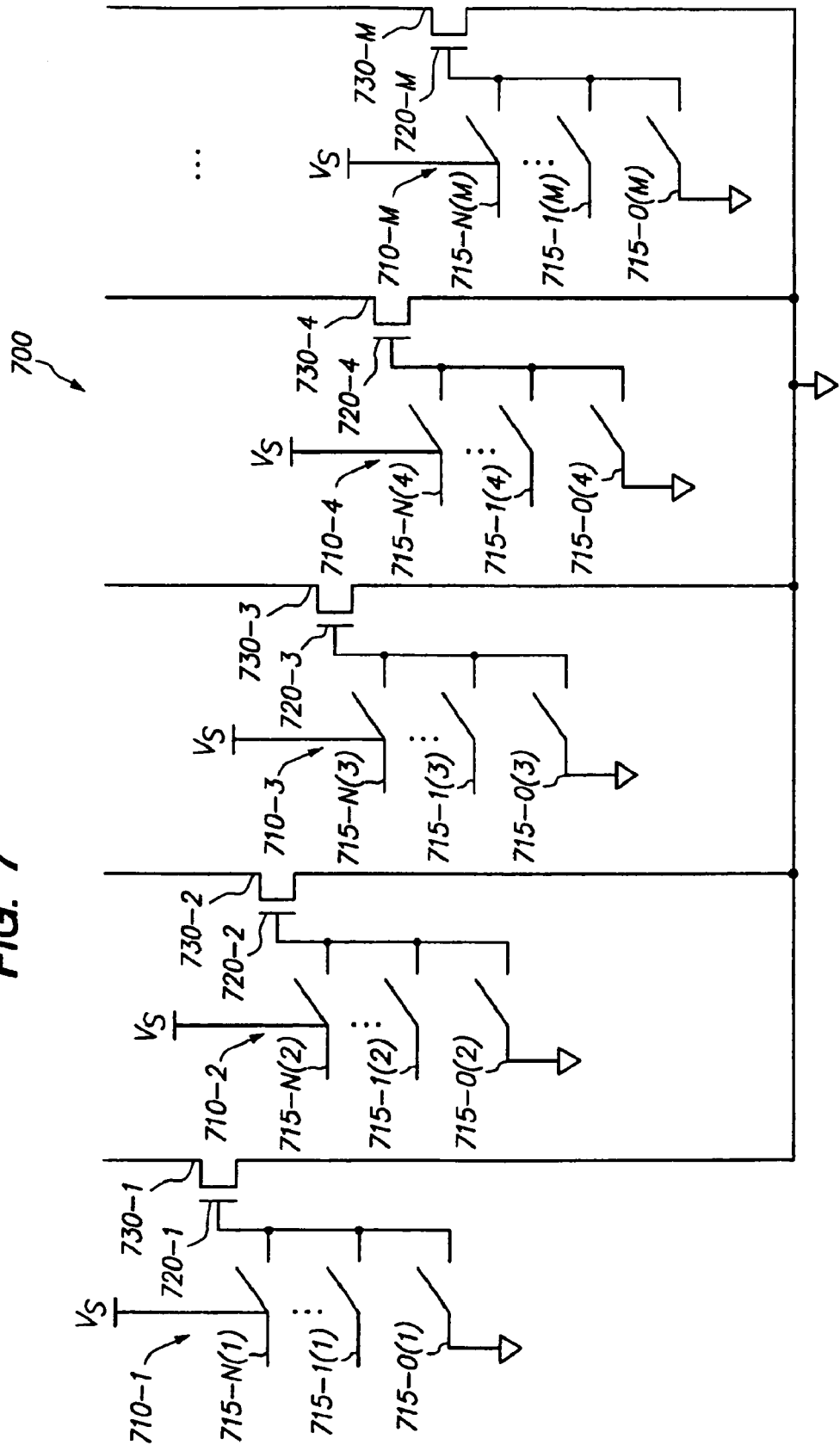
FIG. 7 is a schematic of an implementation including M transistors.

FIG. 7 shows an implementation of a system 700 that provides for both smaller current peaks and smaller settling times. Rather than a single multi-level controller/transistor system, a number of systems are used. That is, M multi-level controllers 710-1 through 710-M are each in communication with a gate 720-1 to 720-M of a switching transistor 730-1 to 730-M. In some implementations, each of the controllers 710-1 through 710-M selectively apply different voltage levels sequentially. For example, controller 710-1 selectively applies voltage levels 715-0(1) through 715-N(1) sequentially, while controller 710-2 selectively applies voltage levels 715-0(2) through 715-N(2) sequentially. The number and/or magnitude of the voltage levels may be the same for each controller or may be different.

M may be chosen to provide desired switching times and peak currents. In some implementations, M may be chosen to be between about 10 and about 1000. By sequentially applying different voltages using the controllers 710-1 through 710-M, transistors 730-1 to 730-M may be turned on and off more quickly without introducing a large transient current on the supply voltage of a PWM output stage.

Figure 8:
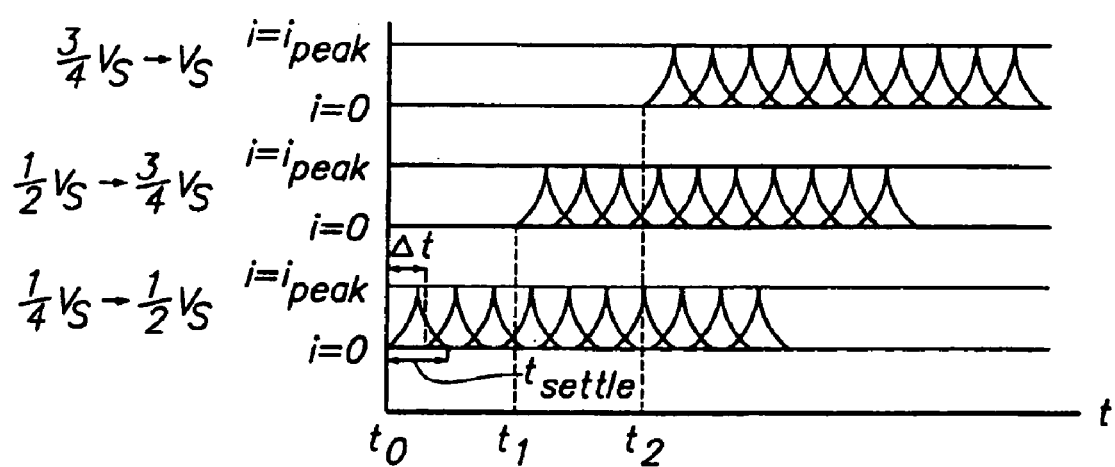
FIG. 8 is a plot of current versus time for an implementation using multiple transistors.

For an example where M=10 and N=4 in a system such as system 700, FIG. 8 shows the current flowing between the charge storage devices and the associated gates of the transistors being switched from ¼$V_s$ to $V_s$ through ½ $V_s$ and ¾ $V_s$. At $t_0$, the voltage applied via controller 710-1 is switched from ¼ $V_S$ to ½ $V_S$. After a time interval $\Delta t$, which may be less than the settling time of the first transistor as shown, the voltage applied via controller 710-2 is switched from ¼ $V_S$ to ½ $V_S$. The voltages applied via controllers 710-3 through 710-10 are subsequently switched from ¼ $V_S$ to ½ $V_S$. Since each transistor 730-1 through 730-10 is relatively small, the settling time $t_{settle}$ as well as the peak current $i_{peak}$ for each is substantially less than in the case where a single large transistor is used.

At a time $t_1$, the voltage applied via controller 710-1 is switched from ½ $V_S$ to ¾ $V_S$. The interval ($t_1$-$t_0$) may be either less than the time required to switch the voltage applied via all controllers 710-1 to 710-10 to ½ $V_S$(as shown in FIG. 8), or may be the same as or greater than the time required to switch the voltage applied via all of the controllers. The voltage applied via the remaining controllers may then be switched from ½ $V_S$ to ¾ $V_S$. Similarly, at a time $t_2$, the voltage applied via controller 710-1 is switched from ¾ $V_S$ to $V_S$, with the voltage applied via the remaining controllers 710-2 through 710-10 being subsequently switched from ¾ $V_S$ to $V_S$.

Although the times used may vary, in some implementations, $\Delta t$ may be on the order of about fifty picoseconds, ($t_1$-$t_0$) may be on the order of about half a nanosecond, and the transition from the high voltage to the low voltage (or vice versa) may be on the order of about five nanoseconds.

Figure 9:
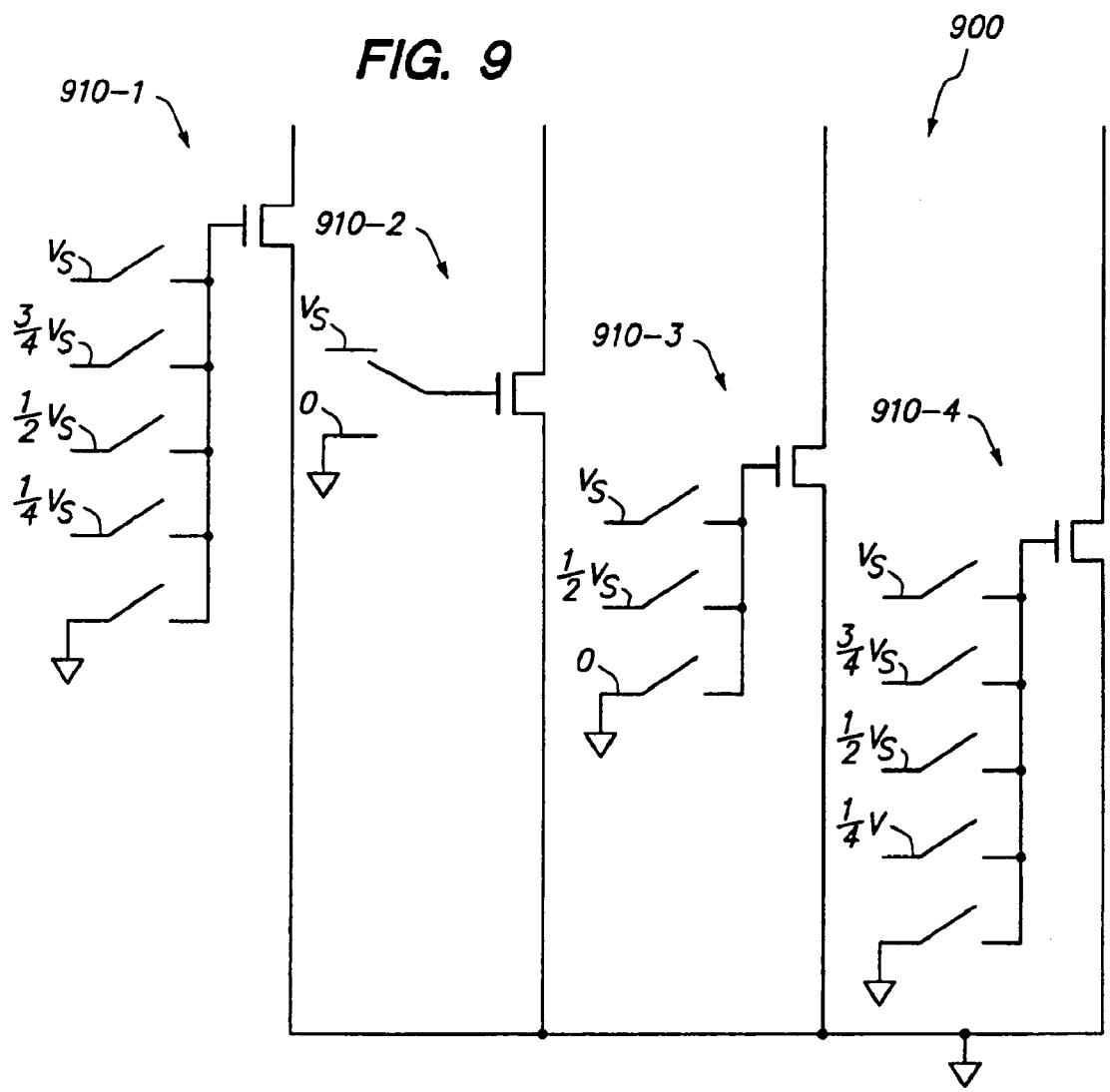
FIG. 9 is a schematic of an implementation including some controllers that are not switched through all intermediate voltage levels.

In some implementations, the voltage applied via some of the controllers may be stepped through fewer than all of the N voltage levels, or directly between the on voltage and the off voltage. This may reduce the time spent in transition between the high and low voltage levels. FIG. 9 shows an implementation where multi-level controllers 910-1 and 910-4 are switched from a low voltage level of 0 volts through three intermediate voltage levels (¼ $V_S$, ½ $V_S$, and ¾ $V_S$) to a high voltage $V_S$.

Rather than selectively applying all of the intermediate voltage levels, the voltage applied via a controller 910-2 is switched directly from the low voltage (in this example, 0 V) to the high voltage $V_S$. The voltage applied via a controller 910-3 is switched through a single intermediate voltage level of ½ $V_S$. Although the structure of controllers 910-2 and 910-3 are shown as different than the structure of controllers 910-1 and 910-4 in FIG. 9, in some implementations each controller may have the same structure. In such an implementation, the sequence of voltage levels applied via particular controllers may be implemented using, for example, software.

Quicker response time may be obtained by reducing the time in the transition between turning off the first switch and turning on the second switch (the "dead time"). The dead time may be reduced by overlapping the transition between switches.

In an example, the first switch may be an NMOS transistor and the second switch may be a PMOS transistor. Prior to turning on the PMOS transistor, the voltage applied to the gate of the NMOS transistor is stepped from $V_{on(N)}$ through the intermediate voltage levels to $V_{off(N)}$. In order to reduce the dead time, the process of turning on the PMOS transistor may be initiated before the voltage applied to the gate of the NMOS transistor is $V_{off(N)}$. For example, the voltage applied to the gate of the PMOS transistor may be changed from $V_{off(P)}$ to the first intermediate voltage level at a time when the voltage applied to the gate of the NMOS transistor is at an intermediate voltage level rather than at $V_{off(N)}$.

Since the PMOS transistor is barely on, the risk of large crowbar current generation during transition between devices is substantially reduced. In some implementations, the values of the lowest voltage level(s) may be chosen to facilitate this transition.

Figure 10:
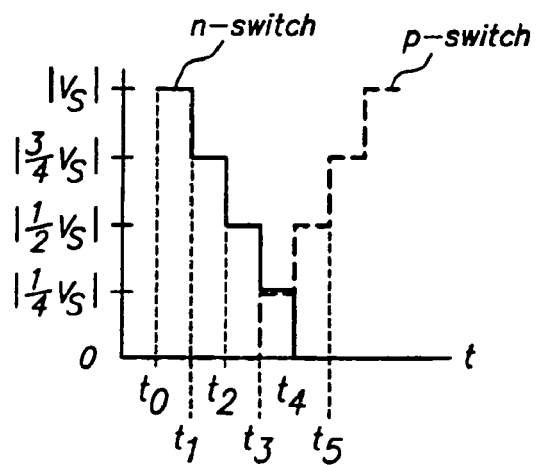
FIG. 10 is a plot of voltage versus time for an implementation in which there is some overlap in a transition between transistors.

FIG. 10 illustrates this process. For this example, the NMOS transistor is on at time $t_0$, with an applied voltage equal to $V_S$. At time $t_1$, the voltage to the gate of the NMOS transistor is reduced from $V_S$ to ¾ $V_S$. At time $t_2$, the voltage is reduced from ¾ $V_S$ to ½ $V_S$.

At time $t_3$, the voltage to the gate of the NMOS transistor is reduced from ½ $V_S$ to ¼ $V_S$. At about the same time, the voltage to the gate of the PMOS transistor is decreased from $V_{off(P)}$ to the first intermediate level (here, from 0 V to about −¼ $V_S$). Thus, the dead time may be reduced by an amount about equal to the settling time.

A number of implementations have been described. Nevertheless, it will be understood that various modifications may be made without departing from the spirit and scope of the invention. For example, although buck configurations have been shown herein for illustration, the described systems and techniques may be used with other implementations of DC/DC converters. Accordingly, other embodiments are within the scope of the following claims.

What is claimed is:

1. An apparatus including a direct current to direct current converter, comprising:
    an output stage comprising a pair of output power transistors; and
    at least one multi-level controller in communication with a gate of a first of the pair of output power transistors;
    wherein the at least one multi-level controller is configured to sequentially communicate N different voltage levels of a monotonic sequence with the gate of the first of the pair of output power transistors, where N is at least three.

2. The apparatus of claim 1, further comprising at least another multi-level controller in communication with a gate of a second of the pair of output power transistors, wherein the at least another multi-level controller is configured to communicate M different voltage levels with the gate of the second of the pair of output power transistors, where M is at least three.

3. The apparatus of claim 1 wherein the at least one multi-level controller comprises a first voltage line and a last voltage line, the last voltage line connected with a drain of the first of the pair of output power transistors and with a bootstrap capacitor, and the first voltage line connected with the bootstrap capacitor and with a diode to connect to a bootstrap voltage.

4. The apparatus of claim 3, wherein the at least one multi-level controller comprises a resistive voltage divider between the first voltage line and the last voltage line, and the at least one multi-level controller comprises multiple decoupling capacitors connected with the resistive voltage divider.

5. The apparatus of claim 1, further comprising:
    a voltage detector connected with the first of the pair of output power transistors; and
    a switch assembly controller responsive to the voltage detector and configured to control the at least one multi-level controller to selectively communicate the N different voltage levels of the monotonic sequence with the gate of the first of the pair of output power transistors.

6. The apparatus of claim 1, wherein the at least one multi-level controller comprises a plurality of multi-level controllers.

7. The apparatus of claim 6, wherein the first of the pair of output power transistors comprises between 10 and 1000 switching transistors, and the plurality of multi-level controllers comprise between 10 and 1000 multi-level controllers, each connected with a respective one of the switching transistors.

8. The apparatus of claim 6, wherein the plurality of multi-level controllers comprise at least a first multi-level controller configured to sequentially communicate the N different voltage levels to the first of the pair of output power transistors, where N is at least three; and at least a second multi-level controller configured to communicate fewer than the N different voltage levels to the first of the pair of output power transistors.

9. The apparatus of claim 8, wherein the first multi-level controller is configured to communicate at least three intermediate voltages, the second multi-level controller is configured to communicate no intermediate voltages, a third multi-level controller is configured to communicate at least one intermediate voltage, and a fourth multi-level controller is configured to communicate the at least three intermediate voltages.

10. The apparatus of claim 6, wherein the plurality of multi-level controllers are each configured to selectively communicate a sequence of voltage levels responsive to programmable control.

11. An apparatus including a direct current to direct current converter comprising:
    first and second opposite switching means for providing output power; and multi-level controller means for sequentially communicating N different voltage levels of a monotonic sequence with the first opposite switching means, where N is at least three.

12. The apparatus of claim 11, further comprising additional multi-level controller means for communicating M different voltage levels with the second opposite switching means, where M is at least three.

13. The apparatus of claim 11, wherein the multi-level controller means comprises first line means for supplying a first voltage from a diode sourced bootstrap voltage to the first opposite switching means and to a bootstrap capacitor; and the multi-level controller means comprises last line means for supplying a last voltage to the first opposite switching means and to the bootstrap capacitor.

14. The apparatus of claim 13, wherein the multi-level controller means comprises resistive voltage divider means between the first line means and the last line means, and the multi-level controller means comprises decoupling capacitive means connected with the resistive voltage divider means.

15. The apparatus of claim 11, further comprising:
means for detecting voltage across the first opposite switching means; and
means for controlling, responsive to the means for detecting voltage, the multi-level controller means to selectively communicate the N different voltage levels of the monotonic sequence with the first opposite switching means.

16. The apparatus of claim 11, wherein the multi-level controller means comprises plural multi-level controller means.

17. The apparatus of claim 16, wherein the first opposite switching means comprises between 10 and 1000 transistor means for switching, and the plural multi-level controller means comprises between 10 and 1000 multi-level controller means, each connected with a respective one of the transistor means for switching.

18. The apparatus of claim 16, wherein the plural multi-level controller means comprises at least a first multi-level controller means for sequentially communicating the N different voltage levels to the first opposite switching means, where N is at least three; and at least a second multi-level controller means for communicating fewer than the N different voltage levels to the first opposite switching means.

19. The apparatus of claim 18, wherein the first multi-level controller means comprises means for communicating at least three intermediate voltages, the second multi-level controller means comprises means for communicating no intermediate voltages, a third multi-level controller means comprises means for communicating at least one intermediate voltage, and a fourth multi-level controller means comprises means for communicating the at least three intermediate voltages.

20. The apparatus of claim 16, wherein the plural multi-level controller means comprise separate multi-level controller means for selectively communicating voltage level sequences responsive to programmable control.

21. A method comprising:
providing output power with an output stage of a direct current to direct current converter, the output stage comprising a pair of output power transistors; and
driving at least a first of the pair of output power transistors by sequentially communicating N different voltage levels of a monotonic sequence with the first of the pair of output power transistors, where N is at least three, using a multi-level controller.

22. The method of claim 21, further comprising driving at least a second of the pair of output power transistors by communicating M different voltage levels with the second of the pair of output power transistors, where M is at least three, using another multi-level controller.

23. The method of claim 21, wherein the driving comprises supplying a first voltage from a diode sourced bootstrap voltage to the first of the pair of output power transistors and to a bootstrap capacitor; and supplying a last voltage to the first of the pair of output power transistors and to the bootstrap capacitor.

24. The method of claim 23, wherein the driving comprises using a resistive voltage divider, and providing transient current to the first of the pair of the output power transistors using decoupling capacitors.

25. The method of claim 21, further comprising:
detecting voltage across the first of the pair of the output power transistors; and
controlling, responsive to the detected voltage, the multi-level controller to selectively communicate the N different voltage levels of the monotonic sequence with the first of the pair of the output power transistors.

26. The method of claim 21, wherein the driving comprises driving the first of the pair of output power transistors using a plurality of multi-level controllers.

27. The method of claim 26, wherein using the plurality of multi-level controllers comprises driving respective ones of 10 to 1000 switching transistors, which compose the first of the pair of output power transistors, with respective ones of 10 to 1000 multi-level controllers.

28. The method of claim 26, wherein using the plurality of multi-level controllers comprises sequentially communicating the N different voltage levels to the first of the pair of output power transistors using a first multi-level controller; and communicating fewer than the N different voltage levels to the first of the pair of output power transistors using a second multi-level controller.

29. The method of claim 28, wherein the sequentially communicating the N different voltage levels using the first multi-level controller comprises communicating at least three intermediate voltages; the communicating fewer than the N different voltage levels using the second multi-level controller comprises communicating no intermediate voltages; and the driving further comprises communicating at least one intermediate voltage level to the first of the pair of output power transistors using a third multi-level controller, and communicating the at least three intermediate voltages to the first of the pair of output power transistors using a fourth multi-level controller.

30. The method of claim 26, wherein using the plurality of multi-level controllers comprises selectively communicating voltage level sequences responsive to programmable control.

* * * * *